INVENTORS
Sho Nakanuma
Toshio Wada
by
Sandoe, Hopgood & Calimafde
ATTORNEYS

INVENTORS
Sho Nakanuma
Toshio Wada
by
Sandoe, Hopgood & Calimafde
ATTORNEYS

United States Patent Office 3,702,790
Patented Nov. 14, 1972

3,702,790

MONOLITHIC INTEGRATED CIRCUIT DEVICE AND METHOD OF MANUFACTURING THE SAME

Sho Nakanuma and Toshio Wada, Tokyo, Japan, assignors to Nippon Electric Company, Limited, Tokyo, Japan Filed Nov. 26, 1969, Ser. No. 880,051
Claims priority, application Japan, Dec. 2, 1968, 43/88,478, 43/88,481
Int. Cl. H01l *7/36, 7/54*
U.S. Cl. 148—1.5 9 Claims

ABSTRACT OF THE DISCLOSURE

A semiconductor integrated circuit device is disclosed in which a plurality of single crystal regions of one conductivity type are formed on a major surface of a substrate of an opposite conductivity type. A polycrystal isolation region is formed on that surface in direct contact with the substrate and surrounds the single crystal regions. Also disclosed are several methods for fabricating that integrated circuit device.

This invention relates generally to monolithic integrated circuit devices and particularly to integrated circuit devices manufactured by polycrystal isolation method (PCI technique).

One known technique for producing semiconductor integrated circuits is the "PCI technique," in which the single crystal regions, which form the circuit elements, are isolated from one another by polycrystal regions. An integrated circuit manufactured by the PCI technique has many remarkable advantages such as a simplified manufacturing process, a high degree of integration, and low parasitic capacitance. These advantages are described in Japanese Monthly Journal "Electronics," November 1968, pp. 1320–21. In this device, the polycrystal region which serves as the isolation region is formed on the insulator film through an epitaxial growth process. An insulator is deposited on the surface of the semiconductor substrate after the forming of the buried layer.

According to the PCI technique, however, a surface roughness of more than 2 microns is brought about on the epitaxial semiconductor substrate after the vapor growth process is completed. This roughness is attributed to the thickness of the silicon dioxide film used as the base for the polycrystal region, and to the differences in the growth rate and bonding condition onto the polycrystal and single crystal regions in their formation. The bonding strength of silicon atoms on the silicon dioxide film and the single crystal surface and that of the silicon dioxide film largely depends upon the reaction conditions in the vapor growth process and the kind of reaction gas used in that process. In addition, as there is a silicon dioxide film between the semiconductor substrate and the polycrystal layer in the conventional integrated circuit using the PCI technique, cracks are often formed due to internal strain caused by the differences in the thermal expansion coefficients during heat treatment. In the practice of the known PCI technique, it is, therefore, very difficult to manufacture the epitaxial semiconductor substrate with high reproducibility on a large-scale industrial production basis.

It is an object of this invention to provide a high quality integrated circuit device having a high reproducibility of production.

It is another object of this invention to provide an improved method of manufacturing integrated circuits employing PCI techniques.

According to this invention, there is provided a monolithic integrated circuit comprising a single crystal semiconductor substrate, a plurality of single crystal regions epitaxially grown on one major surface of said substrate, and an isolation region of polycrystal semiconductor directly deposited onto said substrate and buried in the gaps among said single crystal regions. To deposit the polycrystal region onto the single crystal substrate, a predetermined portion of the substrate surface is subjected to a specified treatment. As herein described, that treatment may be in the form of a contamination treatment with nitrogen molecules or carbon atoms, or a roughening of the surface by a bombardment of an electron beam or an ion beam.

In the structure of this invention, the surface of the single crystal substrate is very smooth and includes no foreign substance such as silicon dioxide deposited thereon. For this reason, the surface of the semiconductor substrate, after being subjected to the vapor growth process, is completely flat. This makes it possible to manufacture an integrated circuit of high reliability. Furthermore, the conventional epitaxial growth method such as those using pyrolysis of monosilane ($SiH_4$) or hydrogen reduction of dichlorosilane, trichlorosilane and silicon tetrachloride, is directly applicable to the vapor growth process of the invention because the condition for bonding polycrystal and single crystal onto the substrate is substantially identical.

To the accomplishment of the above and to such further objects as may hereinafter appear, the present invention relates to a monolithic integrated circuit device and a method of manufacturing the same as defined in the appended claims and as described in the following specification, taken in conjunction with the accompanying drawings, in which:

Figures 1, 2, 3:
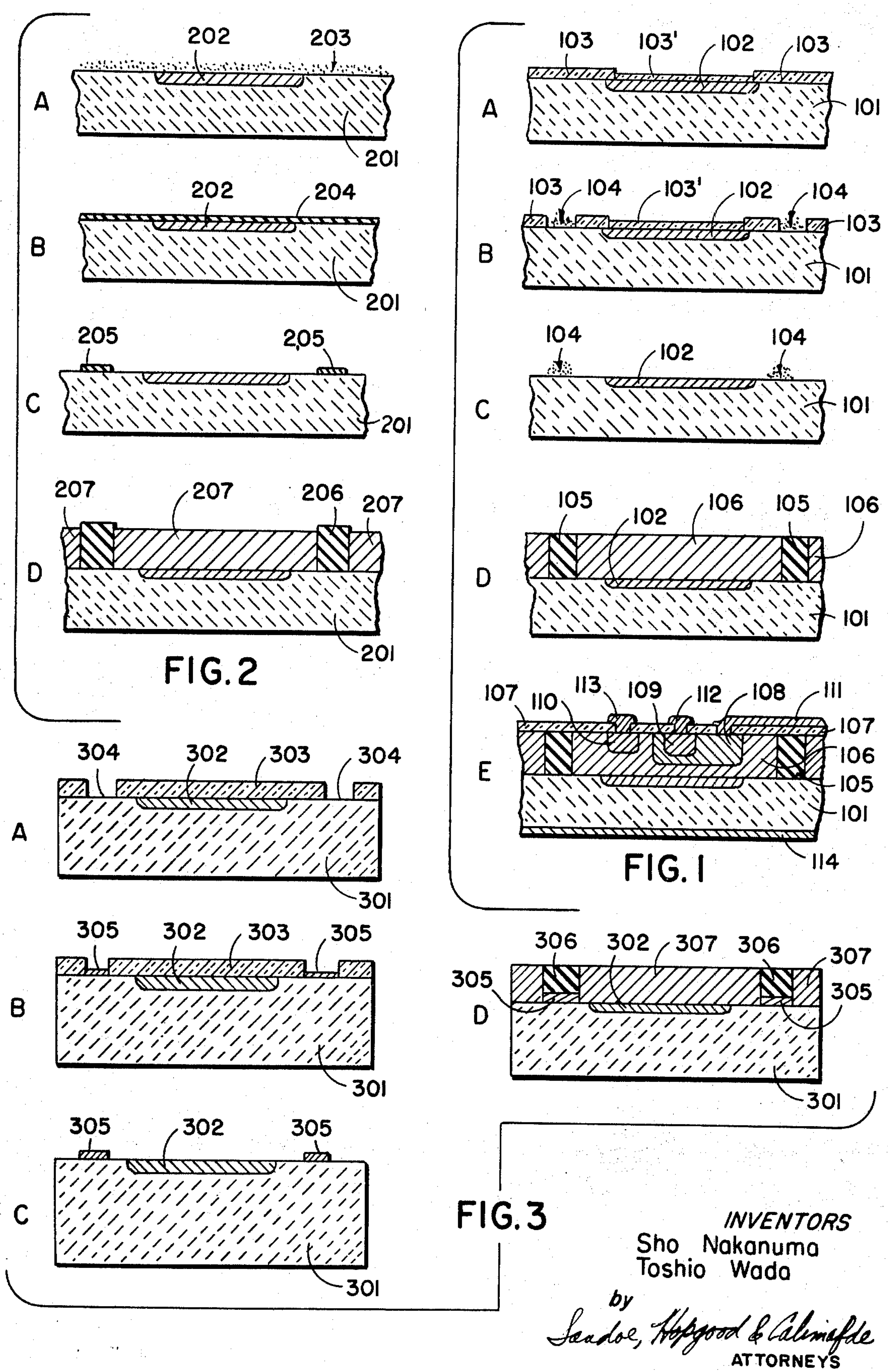
FIGS. 1A–1E are cross-sectional views illustrating the steps of a process of manufacturing an integrated circuit according to a first embodiment of the present invention.
FIGS. 2A–2D are cross-sectional views illustrating the steps of a manufacturing process according to a second embodiment of the present invention.
FIGS. 3A–3D are cross-sectional views illustrating the steps of a manufacturing process according to a third embodiment of the present invention.

Referring to the first embodiment of the invention as illustrated in FIGS. 1A through 1E, an initial substrate as shown in FIG. 1A comprises a silicon dioxide film 103 selectively masked on one surface of a semiconductor substrate 101, and a buried layer 102 is formed in substrate 101 by a diffusion process. This process is the same as in the formation of a conventional monolithic integrated circuit of the bipolar type. Namely, a silicon dioxide film 103 of about one micron in thickness is formed on the surface of the p-type silicon single crystal substrate 101 whose resistivity is approximately 5 ohm-cm. A window for diffusion is then formed in silicon dioxide film 103 such as by a photolithographic etching technique. An n-type impurity, such as antimony, is then diffused at a high density through that window into the substrate 101. During the antimony diffusion process, a silicon dioxide film 103' is grown by thermal oxidation on the upper surface of the buried layer 102. Then, as shown in FIG. 1B, a photolithographic etching process is again applied to silicon dioxide film 103 which has been used as the mask, thereby to expose the surface of the semiconductor substrate 101 to a band pattern. The exposed band pattern indicated at 104 surrounds the buried layer 102. After the formation of the band pattern, the semiconductor substrate is placed in a high temperature nitrogen atmosphere (900° to 1300° C.) for at least several minutes. During this process, the surface of the semiconductor substrate at the portion of the exposed band pattern 104 is contaminated with nitrogen molecules.

As shown in FIG. 1C, the semiconductor substrate, after receiving the nitrogen contamination treamtent, is immersed in a chemical etching solution of hydrofluoric acid system whereby silicon dioxide films 103 and 103', which are attached to the surface of the substrate, are removed. Thereafter a vapor growth process is applied, during which numerous defects, such as stacking faults and grain boundaries having nuclei of nitrogen molecules, are grown on the surface of band pattern 104, thereby forming a polycrystal region 105 and a single crystal region 106 grown on the substrate surface which had been protected by the silicon dioxide films 103 and 103' during the nitrogen treating process.

Both the polycrystal region 105 and single crystal region 106 are of n-type conductivity. The resistivity of the single crystal region 106 is 0.5 ohm-cm. In the vapor growth process, during which the polycrystal and single crystal regions are formed, mono-silane ($SiH_4$) of 0.5 mol percent may be sent together with argon carrier gas at a rate of about 1,000 cc./min. into a reaction system under an atmosphere at a temperature ranging from 1000° C. to 1100° C. and at one atmospheric pressure. In this process, there is almost no difference in the growth rate of the regions 105 and 106, and their surfaces are both extremely smooth. Another vapor grown method has been tried through hydrogen reduction of silicon tetrachloride, in which results similar to those described above were obtained.

The succeeding steps of the process shown in FIGS. 1A–1D are substantially the same as those of the conventional integrated circuit production method. Thus, as shown in FIG. 1E, a surface protective film 107 is disposed on the surface of the growing layer, photolithographic etching, base diffusion, emitter diffusion, lifetime-killer diffusion, etc. are applied to form a p-type base region 108, an emitter region 109, a high density region 110 for leading out the collector electrode, a base electrode lead wire 111, an emitter wiring 112, a collector wiring 113, and a bias electrode 114 on the semiconductor substrate, to form a complete integrated circuit device.

As described above, the process of this invention makes use of the growth of defects such as the stacking fault and grain boundary which has been considered to be a serious problem in the conventional epitaxial process, and it has generally been considered necesary to completely remove these defects from the epitaxial layer. According to the method of this invention, the purpose of the numerous stacking faults is to form the polycrystal region 105 without reducing its bonding strength compared with that of the single crystal region 106. As a result, the surface of the semcionductor substrate after the completion of the growth process can be made flat. According to this method, the diffusion of lifetime-killer using gold or copper may be introduced into the substrate whereby the isolation capability of the polycrystal insulation region can be thoroughly reinforced. The life-time-killer diffusion from the bottom of semiconductor substrate 101 tends to rapidly enter the defects such as a stacking fault. The life-time-killer impurity atoms enter the polycrystal region 105 and gather at the boundary interface of the single crystal region 106, the boundaries of which serve as the wall interface of the polycrystal region 105. The concentration of the impurity atoms serves to form a barrier between the single crystal and polycrystal regions, and thus the isolation peak voltage is increased from about 5 to 50 volts. It has been observed that this barrier is particularly effective in the inegrated circuit of this invention, to wit, where a polycrystal region is grown directly on the surface of a single crystal substrate.

In the above description of one embodiment of the invention, the conductivity type of the semiconductor substrate and other semiconductor regions may be arbitrarily chosen. When a higher peak voltage is necessary, it may be so arranged that the single crystal region 106, which forms a circuit element, is surrounded doubly or triply by the polycrystal regions 105 of a band pattern separating each single crystal region.

FIGS. 2A–2D illustrate the steps according to a second embodiment of the invention. This embodiment employs an initial semiconductor substrate in which a buried layer 202, having a high impurity concentration of one conductivity type, is selectively formed from the surface of a single crystal substrate 201 of the reverse conductivity type. The exposed surface of semiconductor substrate 201 of the reverse conductivity type is placed in a vapor growth furnace in which a hydrogen atmosphere is heated to between 800° and 1300° C. A reaction gas having a mol ratio of hydrogen vs. ammonia of 1:0.01 is introduced into the furnace under the flow hydrogen at a rate of 100 liters/hour whereby the surface 203 of semiconductor substrate 201 is contaminated with nitrogen. Alternatively, a hydrocarbon system gas may be used whereby the surface of the substrate would be contaminated with carbon. In the latter situation, the reaction gas is replaced with monosilane ($SiH_4$).

A vapor growth process is applied to the thus treated substrate in the manner described above with respect to FIG. 1. As a result of this process, as shown in FIG. 2B, a polycrystal layer 204 having a thickness of about 0.3 micron is uniformly grown on the surface of the semiconductor substrate 201. After this process, as shown in FIG. 2C, a photolithographic etching process is applied to the semiconductor substrate 201 to leave a band-pattern polycrystal layer 205. The semiconductor substrate 201 is then again placed in the vapor growth furnace, and its surface is exposed to a mixture of hydrochloride gas and hydrogen gas and is subjected to gas etching. As a result of this gas etching, the surfaces of polycrystal layer 205 and semiconductor substrate 201 are etched to a depth of about 0.2 micron, A vapor growth process is then applied, thereby to form a polycrystal region 206 approximately 15 microns thick at the location of the polycrystal layer 205, and a single crystal region 207 surrounded by polycrystal region 206.

As indicated in FIG. 2D, there is a difference of about 0.2 micron in the height between the boundaries of polycrystal region 206 and single crystal region 207 on the surface of the grown layer after the completion of the vapor growth process. That difference in height, which is usually observed on the surface of the buried layer and other surface of the single crystal region, has no significant adverse effect on the circuit. Since gas etching is applied immediately prior to the vapor growth process, there are no opportunities to grow stacking faults in the single crystal region. Hence the method of the invention is particularly well suited for use in the improvement in quality of devices fabricated by large-scale integration (LSI) techniques or the like.

FIG. 3 shows the sequence of steps of a method according to a third embodiment of the invention. As shown in FIG. 3A, a buried layer 302 is formed in a semiconductor substrate 301 of one conductivity type, and an opening portion 304, which is to surround buried layer 302, is formed in a silicon dioxide film 303, thereby forming a substrate. A gas mixture consisting of silicon tetrachloride (0.5 mol percent) hydrogen (70 mol percent), and nitrogen (29.5 mol percent) is applied to the semiconductor substrate which has been heated to a temperature exceeding 800° C., to deposit silicon thereon and thus form a polycrystal layer 305 of 0.4 micron in thickness in portion 304 as shown in FIG. 3B. By removing the silicon dioxide film 303, a substrate as shown in FIG. 3C is then obtained. Reverse conductivity type silicon is then deposited on the substrate such as by the thermal decomposition of silane, or the hydrogen reduction of silicon tetrachloride, whereby a polycrystal layer 306 is formed on polycrystal region 305, and an epitaxial layer 307 of the single crystal region is grown on the substrate. Thus, a semiconductor integrated circuit device whose structure is substantially the same as that shown in FIGS. 1 and 2 is obtained.

In FIGS. 4A to 4E, the steps for fabricating the semiconductor integrated circuit are illustrated according to a fourth embodiment of this invention. A high concentration n-type buried layer 402 containing antimony at a surface concentration of $10^{19}$ atoms/cm.$^3$ is formed by means of a selective diffusion process on a surface of p-type silicon single crystal substrate 401 having a resistivity of 5 ohm-cm. (FIG. 4A). An aluminum layer 404 of 1 micron in thickness is formed by an evaporation method on silicon dioxide layer 403 which is thermally grown on substrate 401 (FIG. 4B). A photolithographic etching is applied to aluminum layer 404 and silicon dioxide layer 403, thereby exposing the surface of semiconductor substrate 401 in a shape of a band of approximately 10 microns in width surrounding buried layer 402. A bombardment of argon ions as indicated by the arrows 405 is applied uniformly on the surface to convert a part of the exposed semiconductor substrate 401 into an amorphous crystal region 406 (FIG. 4C). Silicon dioxide layer 403 and metal layer 404 are removed from the surface of substrate 401, and an epitaxial layer is grown on that surface of the substrate coarse. Also, such ion bombardreference to the earlier described embodiments, thereby to form n-type single crystal regions 407, 407′ and 407″ each having a resistivity of 0.5 ohm-cm., and a polycrystalline isolation region 408 provided on that amorphous region to isolate and separate single crystal regions 407, 407′ and 407″ (FIG. 4D). A surface protecting layer 409 consisting, for example, of silicon dioxide or silicon nitride are then applied on the thus obtained epitaxial substrate and the substtrate is subjected to p-type and n-type diffusion, thereby to complete the transistor structure having a p-type base region 410, an n-type emitter region 411, a high impurity concentration collector region 412, a base connection 413, an emitter connection 414, and a collector connection 415, all as shown in FIG. 4E.

In this embodiment, the silicon dioxide film 403 and aluminum layer 404 serve as the mask against the bombardment of the argon ion beam, and therefore either layer can be dispensed with when the mechanical energy of the charged ionic particle employed is limited. An ion bombardment other than argon can be realized such as by the use of charged particles of aluminum, boron or a neon-helium gaseous mixture. The intensity of the ion bombardment is preferably in the order of $10^{15}$ ions/cm.$^2$ at 20–80 kev. in the case of aluminum in order to obtain a satisfactory amorphous region 406 without making the surface of the substrate course. Also, such ion bombardment can be realized by placing the semiconductor substrate in the proximity of a plasma discharge.

Figure 4:
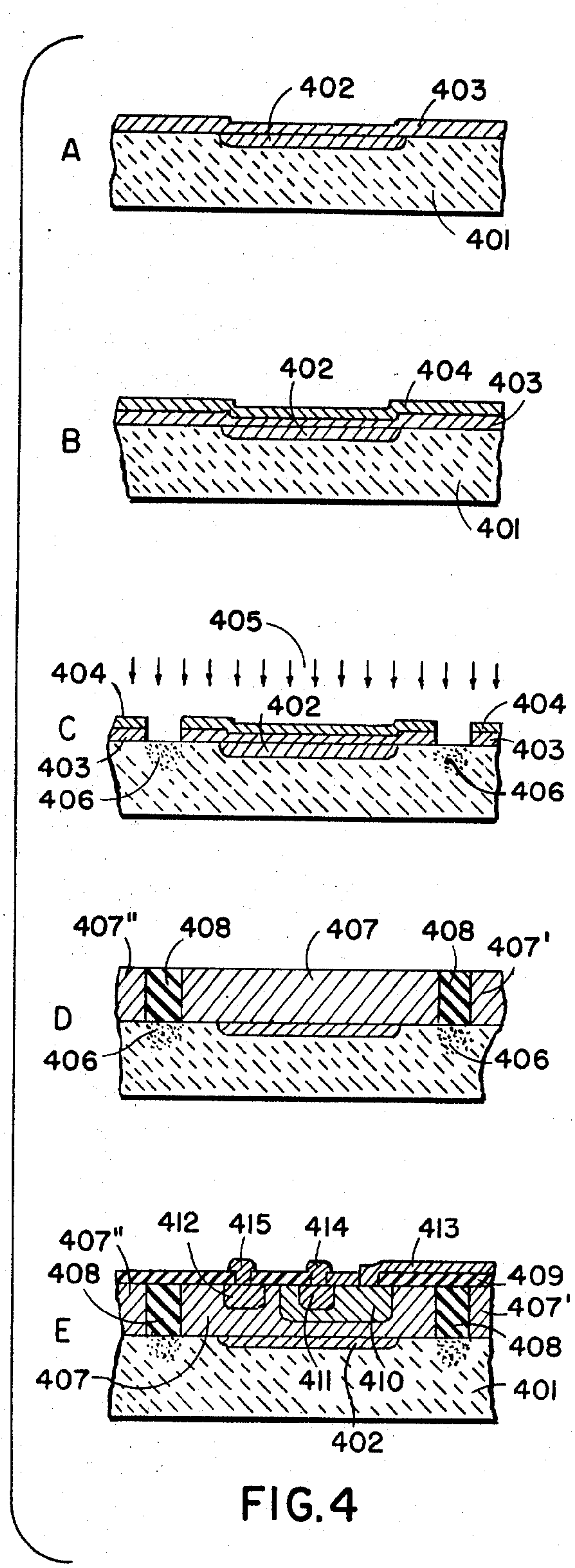
FIGS. 4A–4E are cross-sectional views illustrating the steps of a manufacturing process according to a fourth embodiment of the present invention.

In the substrate of the embodiment of FIG. 4 having an epitaxial layer of between 5 and 30 microns in thickness, the polycrystal region 408 and single crystal region 407 have substantially the same height and the same adhering strength of the silicon atoms to amorphous region 406 and to the single crystal, and therefore form a sufficiently smooth surface. This permits the complete masking effect of the silicon dioxide layer utilized in the succeeding diffusion process, and improves the yield and reliability of the connection layer provided on surface protective layer 409. Epitaxial growth should preferably be carried out at a sufficiently low temperature in order to prevent the recrystallization of the amorphous region during the epitaxial growth process.

Figure 5:
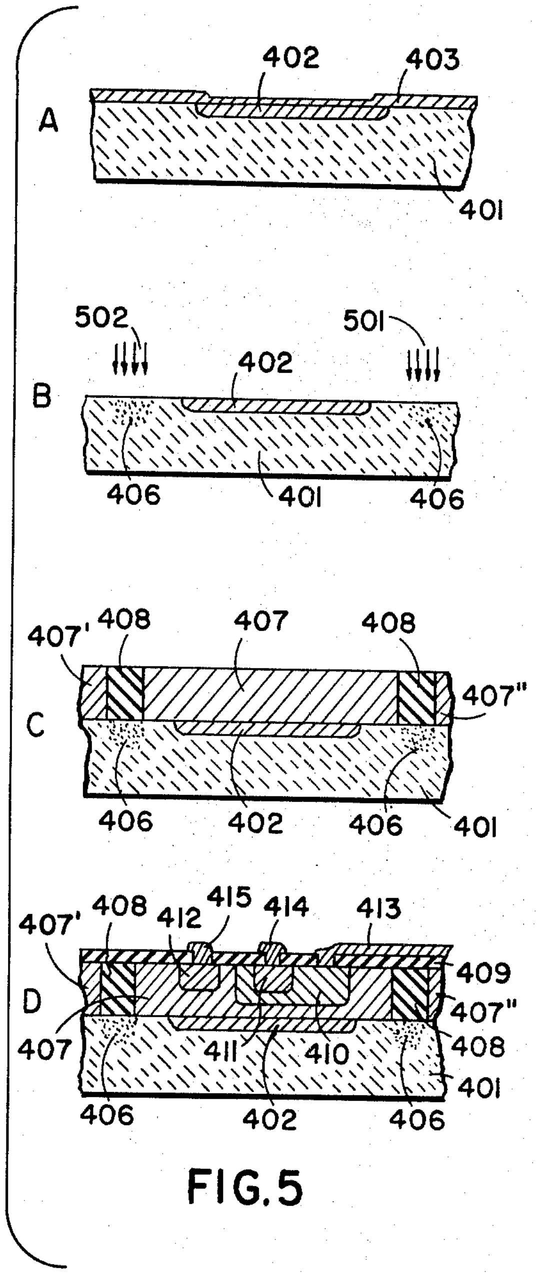
FIGS. 5A–5D are cross-sectional views illustrating the steps of a manufacturing process according to a fifth embodiment of the present invention.

In a modification of this invention illustrated in FIGS. 5A–5D, the integrated circuit is produced using a semiconductor substrate obtained by forming an embedded or buried layer 402 on a surface of silicon single crystal substrate 401 as in the previously described embodiment (FIG. 5A), and then removing the silicon dioxide layer 403 formed on the surface. The portion of the surface on which the polycrystal region is to be formed in the succeeding steps is subjected, as shown in FIG. 5B, to an ion beam 501 of helium, neon, argon, aluminum, boron or phosphorus, or an electron beam 502 concentrated in a portion having a diameter of between 10 to 60 microns. The energy of ion beam 502 may be, for example, 5 μa./cm.$^2$ at 50 kev. with an ion beam vessel containing helium and neon at a pressure ratio of 5:1 to 10:1 and at a total pressure of 1 mm. Hg. The ion beam bombardment can be realized by slightly modifying the method of ion implantation, a technique of impurity injection well known in the field of semiconductor technology. Thus, amorphous region 406 surrounding the surface of semiconductor substrate 401 on which the single crystal regions are to be grown, is formed by scanning the surface of the substrate with an ion beam. Successively, epitaxial growth is carried out as shown in FIGS. 5C and 5D similar to that shown in the previously described example to form single crystal regions 407, 407′ and 407″ and polycrystal region 408 separating the single crystal regions 407, 407′ and 407″, and the integrated circuit is completed by forming base, emitter and collector connections 413, 414 and 415.

In this embodiment, the amorphous region is obtained by means of a scanning ion bombardment or electron beam on the semiconductor substrate, and therefore renders it possible to omit the masking procedure required in possible to omit the masking procedure required in the embodiment of FIG. 4. Moreover, in this embodiment, it is possible to automatically carry out the formation of the amorphous region, since the beam scanning can be electronically automated by registering the starting point.

In the semiconductor integrated circuit device formed according to the methods described in the foregoing embodiments, the semiconductor substrate is in direct contact with the polycrystal region, in contrast to a semiconductor integrated circuit formed by the conventional polycrystal isolation method, wherein the semiconductor substrate is separated from the polycrystal region by a silicon dioxide film. According to the present invention, the internal strain caused by the difference in the thermal expansion coefficients of the semiconductor substrate and the silicon dioxide film located beneath the polycrystal layer, which has been an inherent problem in the circuits fabricated by conventional PCI techniques, is substantially eliminated. In other words, the semiconductor integrated circuit of this invention can be formed without receiving such internal strain, and its electrical characteristics can thus be made even more excellent than those obtainable in an integrated circuit formed according to the p-n junction isolation method. In brief, the method of the present invention permits the manufacture of highly reliable semiconductor integrated circuit devices whose electrical characteristics are superior to those obtainable from integrated circuits manufactured by the conventional PCI techniques. Furthermore, the integrated circuit devices fabricated according to this invention can be manufactured at a far lower cost than those made according to the known p-n junction isolation process.

While only several embodiments of the present invention have been herein specifically disclosed, it will be apparent that variations may be made therein without departure from the spirit and scope of the invention.

We claim:

1. A process of manufacturing a semiconductor integrated circuit comprising the steps of providing a single crystal substrate of a first impurity type, forming an exposed band pattern on a major surface of said substrate, contaminating said exposed band pattern by placing said substrate in an atmosphere comprising a gas selected from the group of nitrogen and a mixture of hydrogen and ammonia, forming a single crystal region on said surface of said substrate other than at said contaminated band pattern, simultaneously forming a polycrystal region of the same semiconductor material as said single crystal region and of a polarity opposite to that of said substrate on said exposed band pattern of said surface of said substrate, and forming a circuit component within said single crystal region.

2. The process of claim 1, in which said contaminating step comprises the step of placing said substrate in a nitrogen atmosphere at a temperature of between 900° C. and 1300° C. for a period of several minutes.

3. A process of manufacturing a semiconductor integrated circuit comprising the steps of providing a single crystal substrate of a first impurity type, contaminating a portion of a major surface of said substrate, growing a polycrystal layer over said contaminated substrate, selectively removing portions of said polycrystal layer from said substrate, forming a single crystal region on said surface of said substrate other than at said contaminated portion, simultaneously forming a polycrystal region of the same semiconductor material as said single crystal region and of a polarity opposite to that of said substrate on said portion of said surface of said substrate, and forming a circuit component within said single crystal region.

4. A process of manufacturing a semiconductor integrated circuit comprising the steps of providing a single crystal substrate of a first impurity type, contaminating a portion of a major surface of said substrate, depositing a protective film over said substrate, forming an opening in said film, forming a polycrystal layer on said substrate in said opening, and thereafter completely removing said protective film, forming a single crystal region on said surface of said substrate other than at said contaminated portion, simultaneously forming a polycrystal region of the same semiconductor material as said single crystal region and of a polarity opposite to that of said substrate on said portion of said surface of said substrate, and forming a circuit component within said single crystal region.

5. A process of manufacturing a semicondlctor integrated circuit comprising the steps of providing a single crystal substrate of a first impurity type forming a protective layer over said substrate, selectively removing said layer to leave exposed a portion of said substrate surface, subjecting said exposed portion of said substrate to an ion bombardment, thereby to form an amorphous crystal region in said substrate directly beneath said exposed portion, and thereafter completely removing said layer, forming a single crystal region on the surface of said substrate other than at said exposed portion, simultaneously forming a polycrystal region of the same semiconductor material as said single crystal region and of a polarity opposite to that of said substrate on said exposed portion of said substrate, and forming a circuit component within said single crystal region.

6. A process of manufacturing a semiconductor integrated circuit comprising the steps of providing a single crystal substrate of a first impurity type, exposing a selected portion of the surface of said substrate to a beam of charged particles, thereby to form at said selected portion an amorphous crystal region, forming a single crystal region on the surface of said substrate other than at said selected portion, simultaneously forming a polycrystal region of the same semiconductor material as said single crystal region and a polarity opposite to that of said substrate on said selected portion of the surface of said substrate, and forming a circuit component within said single crystal region.

7. The method of claim 5, in which said ion bombardment step comprises the use of ions selected from the group consisting of argon, charged aluminum particles, boron, or a neon-helium gaseous mixture.

8. The method of claim 6, in which said charged particle beam is a beam of ions selected from the group consisting of helium, neon, argon, aluminum, boron and phosphor.

9. A process of manufacturing a semiconductor integrated circuit comprising the steps of depositing a thin film of silicon dioxide on one major surface of a single crystal substrate of a first polarity type, diffusing a buried impurity layer through said thin film into said substrate, selectively etching said thin layer for exposing a plurality of limited regions of said surface, contaminating said exposed regions of said substrate by placing said substrate in an atmosphere comprising a gas selected from the group consisting of nitrogen and a mixture of hydrogen and ammonia, and thereafter growing a semiconductor layer on said substrate, thereby to form polycrystal regions on said limited regions and a single crystal region on said surface of said substrate and overlying said buried layer, said polycrystal and single crystal regions being comprised of the same semiconductor material and being of a second polyarity type.

References Cited

UNITED STATES PATENTS

| | | | |
|---|---|---|---|
| 2,842,466 | 7/1958 | Moyer | 148—1.5 |
| 3,460,007 | 8/1969 | Scott, Jr. | 317—235 |
| 3,475,661 | 10/1969 | Iwata et al. | 148—174 |

OTHER REFERENCES

Nakanuma, "Silicon Variable Capacitance Diode etc." IEEE Transactions on Electron Devices, vol. ED–13, No. 7, July 1966, pp. 578, 579, 589.

L. DEWAYNE RUTTEDGE, Primary Examiner

J. M. DAVIS, Assistant Examiner

U.S. Cl. X.R.

148—175; 117—201; 317—235 AT